(12) United States Patent
Spreitzer et al.

(10) Patent No.: US 8,038,903 B2
(45) Date of Patent: Oct. 18, 2011

(54) ORGANIC SEMICONDUCTOR SOLUTIONS

(75) Inventors: Hubert Spreitzer, Viernheim (DE); Susanne Heun, Bad Soden (DE); Neil Tallant, Manchester (GB)

(73) Assignee: Merck Patent GmbH (DE)

( * ) Notice: Subject to any disclaimer, the term of this patent is extended or adjusted under 35 U.S.C. 154(b) by 644 days.

(21) Appl. No.: 11/914,691

(22) PCT Filed: May 15, 2006

(86) PCT No.: PCT/EP2006/004533
§ 371 (c)(1),
(2), (4) Date: Nov. 16, 2007

(87) PCT Pub. No.: WO2006/122732
PCT Pub. Date: Nov. 23, 2006

(65) Prior Publication Data
US 2008/0199600 A1 Aug. 21, 2008

(30) Foreign Application Priority Data
May 18, 2005 (DE) .................. 10 2005 022 903

(51) Int. Cl.
*C09K 11/06* (2006.01)
*H05B 33/12* (2006.01)
*H01L 51/50* (2006.01)

(52) U.S. Cl. .............. 252/301.16; 136/263; 427/66; 427/69; 428/690; 428/917

(58) Field of Classification Search .......... 136/263; 313/503; 427/66, 69; 428/690, 917; 252/301.16
See application file for complete search history.

(56) References Cited

U.S. PATENT DOCUMENTS

| | | | |
|---|---|---|---|
| 5,821,003 A * | 10/1998 | Uemura et al. ............ 428/690 |
| 7,002,013 B1 * | 2/2006 | Chi et al. ............ 546/10 |
| 7,094,897 B2 | 8/2006 | Stossel et al. |
| 7,244,960 B2 | 7/2007 | Spreitzer et al. |
| 7,252,781 B2 * | 8/2007 | Spreitzer et al. ............ 252/77 |
| 7,288,617 B2 * | 10/2007 | Treacher et al. ............ 528/86 |
| 7,416,791 B1 * | 8/2008 | Carlson et al. ............ 428/690 |
| 7,534,853 B2 | 5/2009 | Stossel et al. |
| 7,704,785 B2 | 4/2010 | Steiger et al. |
| 7,820,077 B2 | 10/2010 | Spreitzer et al. |
| 7,820,305 B2 | 10/2010 | Schulte et al. |
| 7,820,822 B2 | 10/2010 | Fortte et al. |
| 2003/0143427 A1 | 7/2003 | Matsuo et al. |
| 2004/0188672 A1 | 9/2004 | Spreitzer et al. |
| 2004/0206939 A1 | 10/2004 | Spreitzer et al. |
| 2004/0225056 A1 | 11/2004 | Spreitzer et al. |
| 2005/0072021 A1 | 4/2005 | Steiger et al. |
| 2006/0058494 A1 | 3/2006 | Busing et al. |
| 2006/0127696 A1 | 6/2006 | Stossel et al. |
| 2006/0149022 A1 | 7/2006 | Parham et al. |
| 2006/0284140 A1 | 12/2006 | Breuning et al. |
| 2007/0080343 A1 | 4/2007 | Heun et al. |
| 2007/0176147 A1 | 8/2007 | Buesing et al. |
| 2007/0231598 A1 | 10/2007 | Busing et al. |

FOREIGN PATENT DOCUMENTS

| | | |
|---|---|---|
| CA | 2448718 A1 | 5/2005 |
| EP | 0880303 A1 | 11/1998 |
| WO | WO-90/13148 A1 | 11/1990 |
| WO | WO-02/072714 A1 | 9/2002 |
| WO | WO 02/077060 * | 10/2002 |
| WO | WO-02/081488 A1 | 10/2002 |
| WO | WO-03/019693 A2 | 3/2003 |
| WO | WO 03/019694 * | 3/2003 |
| WO | WO-03/038923 A1 | 5/2003 |
| WO | WO-2004026886 A2 | 4/2004 |
| WO | WO-2004/037887 A2 | 5/2004 |
| WO | WO-2004070772 A2 | 8/2004 |
| WO | WO-2004113468 A1 | 12/2004 |

OTHER PUBLICATIONS

Scurlock, et al., "Singlet Oxygen as a Reactive Intermediate in the Photodegradation of an Electroluminescent Polymer" *J. Am. Chem. Soc.* (1995), vol. 117, pp. 10194-10202.

Rahn, et al., "Photostability enhancement of Pyrromethene 567 and Perylene Orange in oxygen-free liquid and solid dye lasers," *Applied Optics* (Aug. 20, 1997), vol. 36, No. 24, pp. 5862-5871.

* cited by examiner

*Primary Examiner* — Carol M Koslow
(74) *Attorney, Agent, or Firm* — Connolly Bove Lodge & Hutz LLP

(57) ABSTRACT

The present invention relates to liquid compositions, in particular solutions, of at least one organic semiconductor which emits light from the triplet state, in an organic solvent or solvent mixture, which are characterised in that the content of certain compounds is below a certain limit value, and to the use thereof for the production of layers of the organic semiconductors on substrates, in particular for the electronics industry.

19 Claims, No Drawings

ORGANIC SEMICONDUCTOR SOLUTIONS

RELATED APPLICATIONS

This application is a national stage application (under 35 U.S.C. 371) of PCT/EP2006/004533 filed May 5, 2006, which claims benefit of Germany application 10 2005 022 903.4 filed May 18, 2005.

The present invention relates to solutions of organic semiconductors, and to the use thereof in the electronics industry.

The use of organic semiconductors as functional materials has been reality for some time or is expected in the near future in a number of different applications which can be ascribed to the electronics industry in the broadest sense. In the case of organic electroluminescent devices (OLEDs), the market introduction has already taken place, as confirmed, for example, by the car radios from Pioneer or a digital camera from Kodak with an "organic display". In the case of polymeric light-emitting diodes (PLEDs) too, the first products are available on the market in the form of a small display in a shaver and a mobile telephone from Philips N. V. The general structure of PLEDs of this type is shown in WO 90/13148. In spite of all advances, significant improvements are still necessary in order to make these displays a true competitor to the liquid-crystal displays (LCDs) which currently dominate the market, or to surpass them.

A development which emerged a few years ago, especially in the area of "small molecule" displays, is the use of materials which are able to emit light from the triplet state and thus exhibit phosphorescence instead of fluorescence (M. A. Baldo et al., Appl. Phys. Lett. 1999, 75, 4-6), enabling an up to four-fold increase in energy and power efficiency. Essential conditions which may be mentioned here for practical applicability are, in particular, efficient light emission and a long operating lifetime.

Efforts are recently increasingly being made also to utilise the advantages of vapour-depositable low-molecular-weight triplet emitters for applications which can be processed from solution. Thus, so-called hybrid device structures are being considered which combine the advantages of "small-molecule" OLEDs with those of polymer OLEDs (=PLEDs) and are formed by mixing a low-molecular-weight triplet emitter into a polymer. It is also possible for a plurality of low-molecular-weight compounds to be mixed with one another and processed from solution. It is furthermore possible to incorporate the triplet emitter into a polymer and thus to produce a copolymer. The risk of phase separation during device manufacture and operation is thereby avoided. These methods have the advantage that the compounds can be processed from solution and that an expensive and complex vapour-deposition process, as for devices based on low-molecular-weight compounds, is not necessary. Application from solution will have significant advantages in the long term over the vacuum evaporation process which is common today, especially with respect to scalability, structurability, coating efficiency and economy. Printing processes are the means of choice here. At present, the good controllability, high resolution that can be achieved and great variability mean that most work is being carried out on ink-jet printing processes (IJP, for example EP 0 880 303). In principle, however, other printing processes, such as, for example, offset printing, screen printing, transfer printing or gravure printing, are also suitable.

In particular in the production of organic films or pixels comprising triplet emitters from solution, however, problems are evident which have not yet been solved satisfactorily and which are not known or are not known in this form in the case of the use of fluorescent polymers and blends. Thus, in particular, triplet emitters react very sensitively to the presence of certain compounds in the solution, which can significantly reduce or even completely quench the luminescence of the emitters. This problem is unknown or less important in the case of processing of triplet emitters by vacuum vapour-deposition processes.

The object of the present invention is therefore to offer a technical improvement in this respect. Surprisingly, it has been found that solutions of organic semiconductors which emit light from the triplet state exhibit particularly good properties if the content of certain compounds and impurities in these solutions is below a certain limit value. These impurities are referred to below as "triplet quenchers".

The invention relates to liquid compositions comprising at least one organic semiconductor which emits light from the triplet state, i.e. exhibits phosphorescence, and which is capable of the formation of amorphous films, and at least one organic solvent, which are characterised in that the content of triplet quenchers in the solution is less than 10 ppm.

The liquid compositions according to the invention can be in the form of both a solution and also a dispersion or emulsion, with solutions being preferred. The liquid composition is preferably in the form of a single-phase system.

For the purposes of this application, solutions are taken to mean liquid, homogeneous mixtures of solid substances in liquid solvents in which the solids are dissolved in molecularly disperse form, i.e. the majority of the solid molecules are actually dissolved and are not in the form of aggregates or nano- or microparticles.

For the purposes of this invention, organic solvents are intended to be taken to mean organic substances which are able to bring other substances into solution by the physical route without the dissolving or dissolved substance changing chemically during the dissolution process. Either a pure organic solvent or a mixture of a plurality of organic solvents can be used here. The solubility of the organic semiconductor in the organic solvent or in the mixture of organic solvents at room temperature and atmospheric pressure (20° C. and 1013 mbar) is preferably at least 1 g/l, particularly preferably at least 3 g/l, very particularly preferably at least 5 g/l, in particular at least 10 g/l, with formation of an optically clear flowable solution.

For the purposes of this application, organic semiconductors are low-molecular-weight, oligomeric, dendritic or polymeric, organic or organo-metallic compounds or mixtures of compounds which, as solid or layer, have semiconducting properties, i.e. in which the energy gap between conduction and valence bands is between 1.0 and 3.5 eV.

The organic semiconductor used is either a pure component or a mixture of two or more components, at least one of which must have semiconducting properties and emits light from the triplet state. At least one component of the organic semiconductor is preferably of high molecular weight. This high-molecular-weight component, which may be oligomeric, polymeric or dendritic, has a molecular weight $M_w$ of greater than 3000 g/mol, preferably greater than 10,000 g/mol, particularly preferably greater than 50,000 g/mol. In the case of the use of mixtures, it is not necessary for each of the components to have semiconducting properties. Thus, for example, inert low-molecular-weight compounds can be used in combination with semiconducting polymers. Non-conducting polymers can likewise be used as inert matrix or binder together with one or more low-molecular-weight compounds which have semiconducting properties.

For the purposes of this invention, phosphorescence is taken to mean luminescence stimulated by external energy, for example light or electrical current, in which the emission is generated by a transition from a triplet state or a mixed state comprising an excited singlet state and a triplet state into the singlet ground state. By contrast, fluorescence is taken to mean luminescence stimulated by external energy in which the emission is generated by a transition from an excited singlet state into the singlet ground state. These two processes can be differentiated experimentally through the lifetimes of the excited states, with the lifetime of the excited singlet state being in the order of $10^{-10}$ to $10^{-7}$ s and that of the triplet state being in the order of $>10^{-7}$ s, which can be determined by time-resolved luminescence spectroscopy.

For the purposes of this invention, a triplet emitter is intended to be taken to mean a compound, in particular a metal complex, which emits light from the triplet state at room temperature in electroluminescence, i.e. exhibits electrophosphorescence instead of electrofluorescence. Particularly suitable for this purpose are metal complexes which contain at least one metal having an atomic number of greater than 38, preferably greater than 50. Particularly preferably, at least one metal selected from tungsten, rhenium, ruthenium, osmium, rhodium, iridium, palladium, platinum and gold, in particular iridium and platinum, is present. For the purposes of this application, all complexes which contain these metals and exhibit luminescence are referred to as triplet emitters.

Examples of triplet emitters which are readily soluble in organic solvents are revealed by the applications WO 02/081488, WO 04/026886 and DE 10345572.8. Examples of blends of triplet emitters with suitable polymers and triplet copolymers are revealed by the applications WO 04/070772, WO 04/113468, DE 10349033.7, DE 102004023278.4, DE 102004023277.6 and DE 102004032527.8.

For the purposes of this application, triplet quenchers are compounds which quench the triplet state of the organic semiconductor. These are compounds whose triplet level is at least 0.05 eV lower than the triplet level of the triplet emitter. The crucial factor is thus the position of the triplet level of the triplet quencher relative to the triplet emitter. Thus, it is entirely possible for a compound which has no adverse effect on red triplet emission to result in complete quenching of the luminescence in the case of green triplet emission.

The triplet energy of a compound is taken to mean the energy difference between the lowest triplet state T1 and the singlet ground state S0.

The position of the singlet ground state S0 is preferably determined relative to a known standard by means of cyclic voltammetry by determination of the oxidation potential (energy level of the HOMO). The energy difference between T1 and S0 is preferably determined by spectroscopy, as described, for example, by D. Hertel et al. (*J. Chem. Phys.* 2001, 115, 10007). The absolute position of the triplet level with respect to the vacuum potential E=0 arises from the sum of the energy of the ground state S0 (energy level of the HOMO) and the spectroscopically determined energy difference between T1 and S0. Examples of experimentally determined triplet energies are given, for example, in Turro (N. J. Turro, *Modern Molecular Photochemistry*, University Science Books, Sausalito, Calif., 1991).

Compounds having a low triplet level are, for example, anthracene, pyrene, naphthacene, perylene and also molecular oxygen. In particular, this also includes trace impurities entrained by the solvent.

It has been found that the quenching of the luminescence is significantly reduced if the content of all triplet quenchers in the liquid composition, in particular the solution, in total is less than 10 ppm. The content is preferably less than 1 ppm, particularly preferably less than 0.5 ppm, very particularly preferably less than 0.1 ppm, in particular less than 0.01 ppm. By contrast, it has been observed that significant quenching of the luminescence occurs at a content of greater than about 10 ppm of the triplet quencher. ppm here denotes parts by weight.

The liquid compositions, in particular solutions, according to the invention preferably comprise between 0.01 and 20% by weight, particularly preferably between 0.1 and 15% by weight, very particularly preferably between 0.2 and 10% by weight, in particular between 0.25 and 5% by weight, of the organic semiconductor.

The viscosity of the liquid compositions, in particular solutions, according to the invention is determined by the combination of solvent, concentration of dissolved semiconductor and the molecular weight of the high-molecular-weight component and is not restricted for the purposes of this invention. For the various printing processes mentioned above, however, certain viscosity ranges prove technically necessary. Thus, a range from about 5 to 15 mPas should be indicated, for example, for IJP, while significantly higher viscosities (for example in the range from about 50 to 200 mPas) may be necessary for screen printing. If spin coating or application by doctor blade is used for large-area coating, viscosities in the range from about 10 to 50 mPas may be suitable.

Suitable solvents for the liquid compositions, in particular solutions, according to the invention are those as also used for solutions of fluorescent organic semiconductors. Suitable examples are revealed by the application WO 02/072714. It may furthermore be advantageous to combine solvents in which the organic semiconductor is readily soluble and solvents in which the organic semiconductor has low solubility with one another, as described, for example, in the unpublished applications DE 102004007777.0 (which published as DE 102004007777 and is in the same family as U.S. Pat. No. 7,820,077) and DE 102004023276.8 (which published as DE 102004023276 and is in the same family as U.S. Pat. No. 7,704,785).

It may furthermore also be advantageous to add further additives, as described, for example, in WO 03/019693, in addition to the organic semiconductor or blend.

Preferred solvents are mono- or polysubstituted aromatic solvents, in particular substituted benzenes, naphthalenes, biphenyls and pyridines. Preferred substituents are alkyl groups, which may also be fluorinated, halogen atoms, preferably chlorine and fluorine, cyano groups, alkoxy groups, dialkylamino groups, preferably those having not more than 4 C atoms, and also ester groups. Particularly preferred substituents are fluorine, chlorine, cyano, methoxy, ethoxy, methyl, trifluoromethyl, methylcarboxylate and/or ethylcarboxylate, where a plurality of different substituents may also be present. Non-aromatic solvents, such as, for example, formic acid derivatives, N-alkylpyrrolidones and high-boiling ethers, are also suitable as good solvents.

The use of aldehyde-containing solvents, nitrated aromatic compounds and phosphorus-containing solvents (poor stability of the solutions) and styrene derivatives or other reactive olefins (tendency of the solvents towards polymerisation) has not proven advantageous.

Preference is given to liquid compositions, in particular solutions, according to the invention which comprise, as solvent, at least one solvent selected from 3-fluorobenzotrifluoride, benzotrifluoride, dioxane, trifluoromethoxybenzene, 4-fuorobenzotrifluoride, 3-fluoropyridine, toluene, 2-fluorotoluene, 2-fluorobenzotrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzotrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzodioxole, 4-methylanisole, 3-methylanisole, 4-fluoro-3-methylanisole, 1,2-dichlorobenzene, 2-fluorobenzonitrile, 4-fluoroveratrol, 2,6-dimethylanisole, aniline, 3-fluorobenzonitrile, 2,5-dimethylanisole, 2,4-dimethylanisole, benzonitrile, 3,5-dimethylanisole, N,N-dimethylaniline, 1-fluoro-3,5-dimethoxybenzene, phenyl acetate, N-methylaniline, methyl benzoate, N-methylpyrrolidone, 3,4-dimethylanisole, o-toluntrile, veratrol, ethyl benzoate, N,N-diethylaniline, propyl benzoate, 1-methylnaphthalene, butyl benzoate, 2-methylbiphenyl, 2-phenylpyridine and 2,2'-bitolyl.

It is preferred if the boiling points of all solvents used are above 80° C., particularly preferably above 100° C. The boiling points of all solvents used are furthermore preferably below 300° C., particularly preferably below or equal to 270° C., very particularly preferably below or equal to 250° C. In the case of higher-boiling solvents, the residual solvent after film formation can only be removed completely with difficulty and with considerable technical effort. Boiling point relates to the boiling point under atmospheric pressure (1013 mbar).

The melting point of all solvents used is preferably below or equal to 15° C. This is advantageous, since the solutions must under certain circumstances be stored for days to months between preparation and use and possibly also transported. It must be ensured here that the solutions also remain stable as such and do not freeze during storage, transport and/or in the case of minor temperature variations or suffer other disadvantageous storage and/or transport damage.

In a preferred embodiment of the invention, the solvent or solvent mixture used for the preparation of the liquid compositions, in particular solutions, according to the invention comprises less than 10 ppm of triplet quencher, particularly preferably less than 5 ppm.

In order to prepare the liquid compositions, in particular solutions, the organic semiconductor or blend is dissolved in the desired concentration in the desired solvent or solvent mixture. It may be advantageous to accelerate the dissolution process, for example by heating, shaking and/or stirring. Aggregates of the organic semiconductor may also be comminuted by external mechanical action, for example by ultrasound, as described in WO 03/019694. It has furthermore proven advantageous to filter the solutions before use thereof in order to remove, for example, relatively small amounts of crosslinked constituents or dust particles.

In order to reduce the presence of triplet quenchers, it is advantageous firstly to purify the organic semiconductor in such a way that the solid thereof no longer comprises a significant amount of triplet quencher. It is advantageous here to reduce the content of these triplet quenchers to below the detection limit (for example for GC-MS, HPLC-MS). In practice, this means in any case amounts less than 100 ppm, preferably less than 10 ppm, particularly preferably less than 1 ppm, very particularly preferably less than 0.1 ppm. This can be carried out, for example, by repeated re-crystallisation, by repeated reprecipitation, by extraction methods, by chromatographic methods or by other customary purification methods of organic chemistry. The content of triplet quenchers in the solution can be determined by generally conventional analytical methods, in particular by GC-MS or by HPLC-MS. The process is complete when a further purification step no longer results in an improvement in the device performance.

For the preparation of the liquid compositions, in particular solutions, it is advantageous to use high-purity solvents whose content of triplet quenchers is below the above-mentioned limit.

The invention furthermore relates to a process for the preparation of the liquid compositions, in particular solutions, according to the invention. Since, in particular, the content of certain gases, especially oxygen (which, due to its triplet ground state, is an extremely strong triplet quencher), in the liquid composition, in particular solution, may also have an adverse effect, it is advantageous to prepare the liquid composition, in particular solution, under an inert atmosphere, such as, for example, nitrogen, argon or helium, using degassed solvents and/or to degas the solution after preparation. In order to reduce the content of oxygen to below the above-mentioned limit, the liquid composition, in particular solution, is preferably degassed by passing the protective inert gas through the solution for at least 15 minutes, particularly preferably at least 30 minutes, in particular at least 60 minutes. The oxygen content in the liquid composition, in particular solution, can be determined by an oxygen probe, for example by corresponding probes from Mettler-Toledo (see also Example 1).

The invention furthermore relates to the use of the liquid compositions, in particular solutions, according to the invention for the production of layers of the organic semiconductor on a substrate.

A preferred embodiment here is the use of printing processes. Particular preference is given to the use of ink-jet printing (IJP) processes.

The liquid compositions, in particular solutions, according to the invention of organic semiconductors which emit light from the triplet state are significantly more suitable for the production of organic, electronic devices than are solutions in accordance with the prior art since the luminescence of the layers formed from these films is not quenched or is quenched to a significantly lesser extent, and they therefore exhibit significantly more efficient electroluminescence.

The present application text and also the examples below are directed, in particular, to liquid compositions, in particular solutions, according to the invention for the production of organic and polymeric light-emitting diodes and the corresponding displays. In spite of this restriction of the description, it is possible for the person skilled in the art, without further inventive step, also to use corresponding liquid compositions, in particular solutions, according to the invention for the production of other devices, for example for organic solar cells (O-SCs) or organic laser diodes (O-lasers).

The present invention is explained in greater detail by the following examples without wishing to restrict it thereto. The person skilled in the art will be able to prepare further liquid compositions, in particular solutions, according to the invention from the description and the examples given without an inventive step and to use these to produce layers.

EXAMPLES

Example 1

Sensitivity of a Solution to Oxygen

A solution of polymer TP-009 in toluene is prepared. Polymer TP-009 is a polymer which emits in red from the triplet state ($\lambda_{max}$=627 nm; CIE coordinates approx. 0.67/0.32) and has a composition like material P6 in the application DE 102004032527.8. The batch used here (POLY-2140) has an Mw of 560 kDalton, an Mp of 190 kDalton, an Mn of 90 kDalton, and a solution of 14 g/l in anisole exhibits a viscosity of 7.0 mPas at 20° C. (measured at a shear rate of 40 s$^{-1}$) The toluene used is purchased from MERCK and has the order number #108325.

Four different solutions, each with 100 ml of solution, are prepared. 1.2 g of polymer are added to 100 ml of solvent, and the mixture is stirred at 60° C. for 10 hours. The stirring is in all cases carried out under a protective gas (argon, 99.999999%), but the solutions are treated differently before use. In all cases, the oxygen content in toluene is measured using a modified InPro6800 (Mettler-Toledo) oxygen probe.

Solution 1: Is used without further treatment for the PLED device production. An oxygen content of 68 ppm is detected.

Solution 2: Here, a vigorous stream of argon (about 1-2 bubbles per second) is passed through the solution for 5 minutes with stirring before the further treatment. An oxygen content of 12 ppm is detected.

Solution 3: Analogous to solution 2, but here argon is passed in for 15 minutes. An oxygen content of 1.5 ppm is detected.

Solution 4: Analogous to solutions 2 and 3, but here argon is passed in for 30 minutes. Oxygen is no longer detectable here. In the medium used (toluene), comparative measurements have shown a detection limit of about 0.1 to 0.2 ppm of oxygen.

Test devices are built from the four solutions—as described in WO 04/037887. The device production proceeds here initially in air (ITO cleaning, PEDOT spin coating), the manufacturing steps regarding LEP spin coating (LEP here and below stands for "light-emitting polymer") are carried out in a glove box (residual oxygen content <0.1 ppm), the subsequent vapour deposition of the cathode and the sealing of the device are each carried out with exclusion of air. The layer structure here is in each case ITO, 80 nm PEDOT, 80 nm LEP, about 3 nm Ba, 150 nm Ag. The test diodes have a size of about 3×3 mm$^2$.

The applicational properties (starting values: IVL curves) of these test diodes and the operating lifetimes which can be achieved therewith (drop in luminance to 50% of the initial luminance) are investigated.

The most important results are shown in Table 1:

TABLE 1

Device results for POLY-2140 from solutions 1 to 4.

|  | Max. efficiency [Cd/A] | Voltage for 800 Cd/m$^2$ [V] | Voltage for 5000 Cd/m$^2$ [V] | Lifetime LT-50 at an initial luminance of 800 Cd/m$^2$ [h] |
| --- | --- | --- | --- | --- |
| Solution 1 | 6.5 | 5.8 | 9.2 | 220 |
| Solution 2 | 8.4 | 5.3 | 7.9 | 270 |
| Solution 3 | 8.7 | 5.2 | 7.6 | 320 |
| Solution 4 | 8.7 | 5.1 | 7.5 | 330 |

It can be seen from the results that an oxygen content of 12 ppm exhibits strong effects and an oxygen content of 68 ppm exhibits very strong effects on the device performance. Slight differences are also evident in the case of solutions 3 and 4, but these are in the region of the measurement and device preparation variation.

In order to see whether the strong effect shown above actually plays a role, in particular, in the case of triplet emitters, an analogous experiment is carried out with a polymer which emits from the singlet state.

A solution of polymer POLY1 in toluene is prepared. Polymer POLY1 is a polymer which emits in yellow from the singlet state (CIE coordinates about 0.51/0.49) and has a composition like material POLY1 in application DE 102004023276.8. The batch used here (PY-46) has an Mw of 1600 kDalton, an Mp of 1150 kDalton, an Mn of 310 kDalton, and a solution of 5 g/l in toluene exhibits a viscosity of 55.8 mPas at 20° C. (measured at a shear rate of 40 s$^{-1}$). Toluene is used as above.

Four different solutions, each with 100 ml of solution, are prepared. 0.45 g of polymer is added to 100 ml of solvent, and the mixture is stirred at 60° C. for 24 hours. The stirring is in all cases carried out under a protective gas (argon, 99.999999%), but the solutions are treated differently before use, In all cases, the oxygen content in toluene is measured using a modified InPro6800 (Mettler-Toledo) oxygen probe.

Solution 5: is used without further treatment for the PLED device production. An oxygen content of 33 ppm is detected.

Solution 6: Here, a vigorous stream of argon (about 1-2 bubbles per second) is passed through the solution for 5 minutes with stirring before the further treatment. An oxygen content of 10 ppm is detected.

Solution 7: Analogous to solution 6, but here argon is passed in for 15 minutes. An oxygen content of 0.9 ppm is detected.

Solution 8: Analogous to solutions 6 and 7, but here argon is passed in for 30 minutes. Oxygen is no longer detectable here. As described above, the detection limit is about 0.1 to 0.2 ppm of oxygen.

Analogous test diodes are prepared—as described above.

The applicational properties (starting values: IVL curves) of these test diodes and the operating lifetimes which can be achieved therewith are investigated.

The most important results are shown in Table 2:

TABLE 2

Device results for PY-46 from solutions 5 to 8.

|  | Max. efficiency [Cd/A] | Voltage for 800 Cd/m$^2$ [V] | Voltage for 5000 Cd/m$^2$ [V] | Lifetime LT-50 at an initial luminance of 800 Cd/m$^2$ [h] |
| --- | --- | --- | --- | --- |
| Solution 5 | 11.8 | 3.6 | 4.9 | 980 |
| Solution 6 | 12.1 | 3.4 | 4.8 | 1030 |
| Solution 7 | 12.3 | 3.3 | 4.7 | 1080 |
| Solution 8 | 12.2 | 3.4 | 4.75 | 1050 |

It can be seen from these results that solution 5 exhibits a slight deviation, although this is at the edge of measurement accuracy. Solutions 6 to 8 give results which are identical in the boundaries of measurement accuracy.

However, this clearly shows that the oxygen sensitivity in the case of solutions comprising triplet emitters is much greater than that of singlet emitters.

Example 2

Sensitivity of a Solution to 9-methylanthracene

During a development of an optimised solution mixture for use in IJP, solutions of POLY-2140 described in Example 1 in different mixtures, all of which comprise 1-methylnaphthalene, are prepared and investigated. It is recognised here in the course of time that the device results have been subject to relatively great variations which initially cannot be explained. In order to get onto the track of these variations, the solvents used (inter alia also anisole, 4-methylanisole and the said 1-methylnaphthalene) are investigated in greater detail, firstly by GC and then by GC-MS. Finally, it is found that, depending on the batch, 1-methylnaphthalene comprises small amounts of an impurity which has a molecular weight of about 192 g/mol. More precise identification is not possible owing to the small amounts of substance (between 0 ppm, i.e. undetected, and 35 ppm of the corresponding compound are found per batch of 1-methylnaphthalene). By intensive purification (multiple fractional distillation), the impurity can in all cases be reduced to a content below the detection limit. If these solvents are then used, the variations mentioned above can be avoided.

In order to clarify the outlined phenomenon, the following experiment is carried out:

Four solutions of POLY-2140 already mentioned above in pure 1-methylnaphthalene are prepared. The "highly purified" 1-methylnaphthalene mentioned above is used here. The solution preparation is carried out analogously to Example 1, but in each case only 0.80 g of polymer is dissolved in 100 ml of solvent. All four solutions are also aerated with argon for 30 minutes each. The respective oxygen content is subsequently below the detection limit.

However, small amounts of a potential interfering substance (triplet quencher) which could have similar properties to the above-mentioned impurity are added to the solutions: 9-methylanthracene ($C_{15}H_{12}$, M=192.26 g/mol).

Solution 9: 0.00 mg of 9-methylanthracene (0 ppm).
Solution 10: 0.15 mg of 9-methylanthracene (approx. 1.5 ppm).
Solution 11: 1.2 mg of 9-methylanthracene (approx. 12 ppm).
Solution 12: 6.8 mg of 9-methylanthracene (approx. 68 ppm).

Analogous test diodes are prepared—as described in Example 1. However, a difference should be noted here: since 1-methylnaphthalene has a very high boiling point (243° C.), the substrate is simultaneously irradiated with an NIR heat source during the LEP spin coating (see WO 03/038923) in order to produce homogeneous films. Nevertheless—as always with this solvent—somewhat poorer device properties are found, which can presumably be attributed to somewhat poorer film formation by spin coating from this high-boiling solvent.

The applicational properties (starting values: IVL curves) of these test diodes and the operating lifetimes which can be achieved therewith are investigated.

The most important results are shown in Table 3:

TABLE 3

Device results for POLY-2140 from solutions 9 to 12.

| | Max. efficiency [Cd/A] | Voltage for 800 Cd/m² [V] | Voltage for 5000 Cd/m² [V] | Lifetime LT-50 at an initial luminance of 800 Cd/m² [h] |
|---|---|---|---|---|
| Solution 9 | 7.6 | 6.3 | 10.1 | 300 |
| Solution 10 | 7.5 | 6.2 | 10.0 | 300 |
| Solution 11 | 7.0 | 6.2 | 10.1 | 280 |
| Solution 12 | 5.1 | 6.6 | 10.8 | 240 |

It can be seen from the results that solutions 9 and 10 give virtually identical device results, while the properties of solution 11 deteriorate somewhat, those of solution 12 greatly. It is thus clearly evident that a material such as the 9-methylanthracene used has drastic effects on the device properties if present in corresponding solutions in a content in the region of 10 ppm or more.

Since 9-methylanthracene has a triplet energy of about 1.82 eV and an HOMO position of about 5.8-5.6 eV, the difference gives a triplet level of about 4.0-3.8 eV (vs. vacuum). Polymer TP-009 has a triplet energy of about 2.0-1.9 eV and an HOMO position of about 5.2 eV. This gives a triplet level of about 3.2-3.3 eV (vs. vacuum). It can thus be seen that the triplet level of 9-methylanthracene is lower than that of polymer TP-009. This suggests the conjecture that 9-methylanthracene "scavenges" triplet excitons and releases the energy then acquired in a non-radiative manner. The solvent itself is not interfering here, the triplet energy is in the region of about 2.7 eV.

In order to support this assumption, a comparative experiment is carried out:

As in Example 1, the analogous solutions 13 to 16 comprising the fluorescent polymer PY-46 are prepared in 1-methylnaphthalene. Here, in each case 0.4 g of polymer is dissolved in 100 ml of solvent analogously to the details in Example 1 and the measures described above in Example 2 (degassing, highly purified solvent).

Various amounts of 9-methylanthracene are then added to the solutions, likewise analogously to that described above:

Solution 13: 0.00 mg of 9-methylanthracene (0 ppm).
Solution 14: 0.18 mg of 9-methylanthracene (approx. 1.8 ppm).
Solution 15: 1.6 mg of 9-methylanthracene (approx. 16 ppm).
Solution 16: 6.0 mg of 9-methylanthracene (approx. 60 ppm).

The solutions are investigated analogously to the above by preparation of test diodes. The results are shown in Table 4:

TABLE 4

Device results for PY-46 from solutions 13 to 16.

| | Max. efficiency [Cd/A] | Voltage for 800 Cd/m² [V] | Voltage for 5000 Cd/m² [V] | Lifetime LT-50 at an initial luminance of 800 Cd/m² [h] |
|---|---|---|---|---|
| Solution 13 | 10.2 | 3.5 | 5.1 | 950 |
| Solution 14 | 10.3 | 3.6 | 5.1 | 930 |
| Solution 15 | 10.1 | 3.5 | 5.2 | 960 |
| Solution 16 | 10.3 | 3.6 | 5.1 | 940 |

It is not difficult to see from these results that 9-methylanthracene has no effect on the device properties of the fluorescent polymer.

The conclusion can thus be drawn that 9-methylanthracene actually functions as triplet quencher and selectively quenches triplet-emitting materials.

The invention claimed is:

1. A liquid composition comprising
   (1) at least one low molecular weight organic semiconductor which emits light from the triplet state and which is capable of the formation of amorphous films, and
   (2) at least one organic solvent, and
   wherein the organic semiconductor is a metal complex which contains at least one metal having an atomic number of greater than 38, and the content of triplet quenchers in the solution is present in an amount less than 10 ppm and
   wherein the composition contains 0.01-20% by weight of an organic semiconductor.

2. The composition according to claim 1, wherein the liquid composition is in the form of a solution, dispersion or emulsion.

3. The composition according to claim 2, wherein the composition is in the form of a single-phase system.

4. The composition according to claim 1, wherein the solubility of the organic semiconductor in the organic solution or in the mixture of organic solvents at room temperature and atmospheric pressure is at least 1 g/l.

5. The composition according to claim 1, wherein the triplet emitters used are metal complexes which emit light from the triplet state at room temperature in electroluminescence and which contain at least one metal having an atomic number of greater than 50.

6. The composition according to claim 5, wherein the triplet emitter contains at least one metal selected from the group consisting of tungsten, rhenium, ruthenium, osmium, rhodium, iridium, palladium, platinum and gold.

7. The composition according to claim 1, wherein the triplet level of the triplet quencher is at least 0.05 eV lower than the triplet level of the triplet emitter.

8. The composition according to claim 1, wherein the triplet quencher is molecular oxygen.

9. The composition according to claim 1, wherein the content of the triplet quencher is less than 1 ppm.

10. The composition according to claim 1, wherein the solvents are mono- or polysubstituted aromatic solvents or non-aromatic solvents.

11. The composition according to claim 1, wherein the solvents are
(1) substituted benzene,
(2) substituted naphthalene,
(3) substituted biphenyl
(4) substituted pyridine, or
(5) non-aromatic solvents selected from formic acid derivatives, N-alkylpyrrolidones and high-boiling ethers and
wherein the substituents for benzene, naphthalene, biphenyl or pyridine are
alkyl groups, which may also be fluorinated,
halogen atoms,
cyano groups,
alkoxy groups,
dialkylamino groups or
ester groups.

12. The composition according to claim 11, wherein at least one solvent is selected from the group consisting of 3-fluorobenzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzotrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzodioxole, 4-methylanisole, 3-methylanisole, 4-fluoro-3-methylanisole, 1,2-dichlorobenzene, 2-fluorobenzonitrile, 4-fluoroveratrol, 2,6-dimethylanisole, aniline, 3-fluorobenzonitrile, 2,5-dimethylanisole, 2,4-dimethylanisole, benzonitrile, 3,5-dimethylanisole, N,N-dimethylaniline, 1-fluoro-3,5-dimethoxybenzene, phenyl acetate, N-methylaniline, methyl benzoate, N-methylpyrrolidone, 3,4-dimethylanisole, o-tolunitrile, veratrol, ethyl benzoate, N,N-diethylaniline, propyl benzoate, 1-methylnaphthalene, butyl benzoate, 2-methylbiphenyl, 2-phenylpyridine and 2,2'-bitolyl.

13. The composition according to claim 1, wherein the boiling points of all solvents used are above 80° C.

14. The composition according to claim 1, wherein the solvent(s) used comprise(s) less than 10 ppm of triplet quencher.

15. A process for the preparation of the composition according to claim 1, which comprises preparing the composition under an inert atmosphere and/or using degassed solvents and/or the composition are degassed after preparation.

16. The process according to claim 15, wherein the composition is degassed by passing an inert gas through the liquid composition for at least 15 minutes.

17. A process for the production of layers which comprises applying the composition according to claim 1 on a substrate.

18. In a printing process wherein the improvement comprises using the composition according to claim 1.

19. The printing process according to claim 18, wherein the printing process is ink-jet printing.

* * * * *